(12) United States Patent
Fontana, Jr. et al.

(10) Patent No.: US 7,633,718 B2
(45) Date of Patent: Dec. 15, 2009

(54) LEAD CONTACT STRUCTURE FOR EMR ELEMENTS

(75) Inventors: Robert E. Fontana, Jr., San Jose, CA (US); Stefan Maat, San Jose, CA (US)

(73) Assignee: Hitachi Global Storage Technologies Netherlands, B.V., Amsterdam (NL)

(*) Notice: Subject to any disclaimer, the term of this patent is extended or adjusted under 35 U.S.C. 154(b) by 581 days.

(21) Appl. No.: 11/168,070

(22) Filed: Jun. 27, 2005

(65) Prior Publication Data
US 2006/0289984 A1     Dec. 28, 2006

(51) Int. Cl.
G11B 5/48    (2006.01)
G11B 21/16   (2006.01)
G11B 5/33    (2006.01)
G11B 5/127   (2006.01)

(52) U.S. Cl. .................... 360/245.8; 360/313
(58) Field of Classification Search .......... 360/313, 360/324, 318, 245.8
See application file for complete search history.

(56) References Cited

U.S. PATENT DOCUMENTS

| | | | |
|---|---|---|---|
| 5,063,174 A | | 11/1991 | Beyea et al. |
| 5,309,022 A | | 5/1994 | Gill et al. |
| 6,634,087 B2 | | 10/2003 | Horng et al. |
| 6,707,122 B1 | * | 3/2004 | Hines et al. ............ 257/421 |
| 6,804,089 B2 | | 10/2004 | Funayama et al. |
| 7,082,838 B2 | * | 8/2006 | Rowe et al. ............ 73/777 |
| 7,203,036 B2 | * | 4/2007 | Chattopadhyay et al. .... 360/313 |
| 2002/0173941 A1 | * | 11/2002 | Hines et al. ............ 703/13 |
| 2006/0002030 A1 | * | 1/2006 | Carey et al. ............ 360/313 |
| 2006/0018054 A1 | * | 1/2006 | Chattopadhyay et al. .... 360/313 |
| 2006/0022672 A1 | * | 2/2006 | Chattopadhyay et al. .... 324/252 |
| 2006/0023369 A1 | * | 2/2006 | Carey et al. ............ 360/324 |

OTHER PUBLICATIONS

M. Holz, O. Kronenwerth, D. Grundler, "Optimization of the Extraordinary Magnetoresistance in Semiconductor-Metal Hybrid Structures for Magnetic-Field Sensor Applications" Physica E, 2003, pp. 879-900.

(Continued)

Primary Examiner—Andrea L Wellington
Assistant Examiner—Adam B Dravininkas
(74) Attorney, Agent, or Firm—Duft Bornsen & Fishman, LLP

(57) ABSTRACT

EMR elements and methods of fabricating the EMR elements are disclosed. The EMR structure includes one or more layers that form an active region, such as a two-dimensional electron gas (2DEG). The EMR structure has a first side surface, having a plurality of lead protrusions that extend outwardly from the main body of the EMR structure, and an opposing second side surface. The lead protrusions are used to form the current and voltage leads for the EMR element. The active region extends through each lead protrusion and is accessible along a perimeter of each of the lead protrusions. Conductive material is formed along the perimeter of each lead protrusion and contacts the active region of the EMR structure along the perimeter. The lead protrusion and the corresponding conductive material contacting the active region of each lead protrusion form leads for the EMR element, such as current leads and voltage leads.

16 Claims, 10 Drawing Sheets

OTHER PUBLICATIONS

Matthias Holz, Oliver Kronenwerth, and Dirk Grundler, "Semiconductor-Metal Hybrid Structures: Novel Perspective for Read Heads" Institut fur Theoretische Physik, Universitat Hamburg, May 2003, pp. 1245-1248.

S.A. Solin, D.R. Hines, A.C.H. Rowe, NEC Research Institute; J.S. Tsai, Yu A. Pashkin, NEC Fundamental Research Laboratories; S.J. Chung, N. Goel, M.B. Santos, Department of Physics and Astronomy, University of Oklahoma, "Nonmagnetic Semiconductors as Read-Head Sensors for Ultra-High-Density Magnetic Recording" Applied Physics Letters, vol. 80, No. 21, May 27, 2002, pp. 4012-4014.

J. Moussa, Department of Physics, Worcester Polytechnic Institute; L.R. Ram-Mohan, Department of Physics and Department of Electrical and Computer Engineering, Worcester Polytechnic Institute; A.C.H. Rowe, NEC Research Institute; S.A. Solin, Department of Physics, Washington University in St. Louis, "Response of an Extraordinary Magnetoresistance Read Head to a Maganetic Bit" Journal of Applied Physics, vol. 94, No. 2, Jul. 15, 2003, pp. 1110-1114.

T. Zhou, D.R. Hines, S.A. Solin, "Extraordinary Magnetoresistance in Externally Shunted Van Der Pauw Plates" NEC Research Institute, vol. 78, No. 5, Jan. 29, 2001, pp. 667-669.

* cited by examiner

1102

1102

LEAD CONTACT STRUCTURE FOR EMR ELEMENTS

BACKGROUND OF THE INVENTION

1. Field of the Invention

The invention is related to the field of magnetic disk drive systems and, in particular, to a lead contact structure and methods of generating the structures for extraordinary magnetoresistive (EMR) elements.

2. Statement of the Problem

A magnetoresistive (MR) read element based on extraordinary magnetoresistance (EMR) has been proposed for magnetic recording hard disk drives. Because the active region in the EMR element is formed of nonmagnetic semiconductor materials, the EMR read element does not suffer from the problem of magnetic noise that exists in giant magnetoresistive (GMR) elements and tunneling magnetoresistive (TMR) elements, both of which use magnetic films in their active regions.

The EMR read element includes an EMR structure that is fabricated on a substrate as a mesa comprising a semiconductor heterostructure. The EMR structure referred to herein comprises layers of semiconductor material. A subset of the layers of semiconducting material comprises a 2D electron or hole gas which is referred to herein as the EMR active region. A pair of voltage leads and a pair of current leads are formed on one side surface of the mesa in contact with an active region of the EMR structure, and an electrically conductive metal shunt is formed on an opposing side surface of the mesa in contact with active region. In the absence of an applied magnetic field, injected current through the current leads passes into the active region and is shunted through the metal. When an applied magnetic field is present, current is deflected from the shunt and travels a longer distance through the active region. Because the semiconductor is much more resistive than the shunt, the electrical resistance of the device increases. The change in electrical resistance due to the applied magnetic field is detected across the voltage leads. EMR is described by T. Zhou et al., "Extraordinary magnetoresistance in externally shunted van der Pauw plates", *Appl. Phys. Lett.*, Vol. 78, No. 5, 29 Jan. 2001, pp. 667-669. An EMR element for recording head applications is described by S. A. Solin et al., "Nonmagnetic semiconductors as read-head sensors for ultra-high-density magnetic recording", *Appl. Phys. Lett.*, Vol. 80, No. 21, 27 May, 2002, pp. 4012-4014.

One problem for fabricators of EMR read elements is providing low ohmic contact resistances between the active region of the EMR structure and the current and voltage leads. As is illustrated in FIG. 1, a typical lead is formed on one side surface of the mesa. One end of the lead extends above the top of the EMR structure while the other end extends outwardly from the side surface of the mesa to provide a contact point. The contact resistance area is determined by the thickness of the active region and the width of the lead contacting the active region. The problem is magnified as the EMR read elements are fabricated on the sub-micron scale, as the thickness of the active region and the width of the leads are decreased. Assuming a contact resistance area product of 1E-7 Ohm·cm$^2$, a 20 nm thick active region, and a 20 nm wide lead, the contact resistance would be 25 kOhms for each lead. This contact resistance far exceeds the typical resistance of EMR elements, which is a few ohms.

Another problem is that the leads of a typical EMR read element are not planar with the top of the EMR structure. Magnetic recording applications for EMR read elements require that the active region (the 2DEG) of the EMR read element be in close proximity to the disk surface. Any non-planarity (i.e., leads higher than the surface of the EMR structure) requires a larger spacing between the disk media and the EMR structure since the top surface of the leads now set the minimum spacing rather than the top surface of the EMR structure. The resulting increased spacing reduces signal and resolution characteristics of the EMR read element. Furthermore, in one mode of operation the EMR read element is riding on an air-cushion with its top surface being the air bearing surface. For this mode of operation, a generally planar top surface is desirable to obtain a flyable EMR read element.

SUMMARY OF THE SOLUTION

The invention solves the above and other related problems with a structure for an EMR element, and corresponding methods of fabrication, that increases the contact area between the active region of an EMR structure and the conductive material for the current and voltage leads. The increased contact area advantageously reduces the ohmic contact resistances of the leads.

In one embodiment of the invention, an EMR element has an EMR structure that has a different shape than prior EMR structures. The EMR structure includes one or more layers that form an active region, such as a two-dimensional electron gas (2DEG) or hole gas (2DHG). The EMR structure has a first side surface and an opposing second side surface. The first side surface has a plurality of lead protrusions that extend outwardly from the main body of the EMR structure. The lead protrusions are used to form the current and voltage leads for the EMR element. The active region extends through each lead protrusion and is accessible along a perimeter (or outer side surfaces) of each of the lead protrusions. For the EMR element, conductive material is formed along the perimeter of each lead protrusion. The conductive material contacts the active region of the EMR structure along the perimeter. The lead protrusions and the corresponding conductive material contacting the active region of each lead protrusion form leads for the EMR element, such as current leads and voltage leads.

Each lead of the EMR element has an increased contact area between the conductive material and the active region as compared to most prior EMR elements. The contact area between the conductive material and the active region spans the perimeter of each lead protrusion. Therefore, ohmic contact resistance of each lead of the EMR element is advantageously reduced.

Another embodiment of the invention comprises a method of fabricating an EMR element. To begin, the layers of semiconductor EMR material are deposited on some type of substrate. At least one of the layers of EMR material forms an active region, such as a 2DEG. A photo-resist is then formed on the EMR material. The photo-resist is patterned to define the EMR structure as described above with the lead protrusions on one side. A removal process, such as ion milling or reactive ion etching (RIE), is performed to remove the excess EMR material not protected by the photo-resist. After the removal process, an EMR structure having the desired lead protrusions on one side exists underneath the photo-resist. Conductive material is then deposited on the photo-resist and around the EMR structure. The conductive material contacts the active region around the perimeter of the EMR structure, including around the perimeter of each of the lead protrusions. Another removal process is then performed to remove the photo-resist and the conductive material on top of the photo-resist. The EMR structure with a plurality of lead protrusions one side, and the conductive material surrounding the EMR structure remain after the removal process. Another photo-resist is then placed to cover the portion of the EMR structure and the portion of the conductive material that is to remain. The photo-resist covers a portion of the conductive material surrounding the perimeter of each lead protrusion of the EMR structure, which will form the leads for the EMR element. The photo-resist also covers a portion of the conductive material along another side of the EMR structure, which will form the shunt for the EMR element. Another removal process is then performed to remove the material not protected by the photo-resist. The photo-resist is removed, leaving the desired EMR element.

One advantage of this fabrication method is that the conductive material, by being deposited in this manner, is self-aligned with the active region of the EMR structure. Another advantage of this fabrication method is that the contact junction between the conductive material and the active region is formed using a single mask. For narrow trackwidth sensors, it is critical that the edges of the sensor corresponding to lead/EMR material interfaces be precisely controlled since the distance between the edges defines the critical sensitivity region of the sensor. The use of single mask process to form the interface edge by construct, self aligns the materials at the edge, and this in turn results in precise control of a critical dimension with a single process and a single lithography step. EMR elements will have dimensions in the 30 nm to 90 nm region and a self aligned process assures the manufacturable formation of these dimensions.

The invention may include other exemplary embodiments described below.

DESCRIPTION OF THE DRAWINGS

The same reference number represents the same element on all drawings.

DETAILED DESCRIPTION OF THE INVENTION

Figure 1:
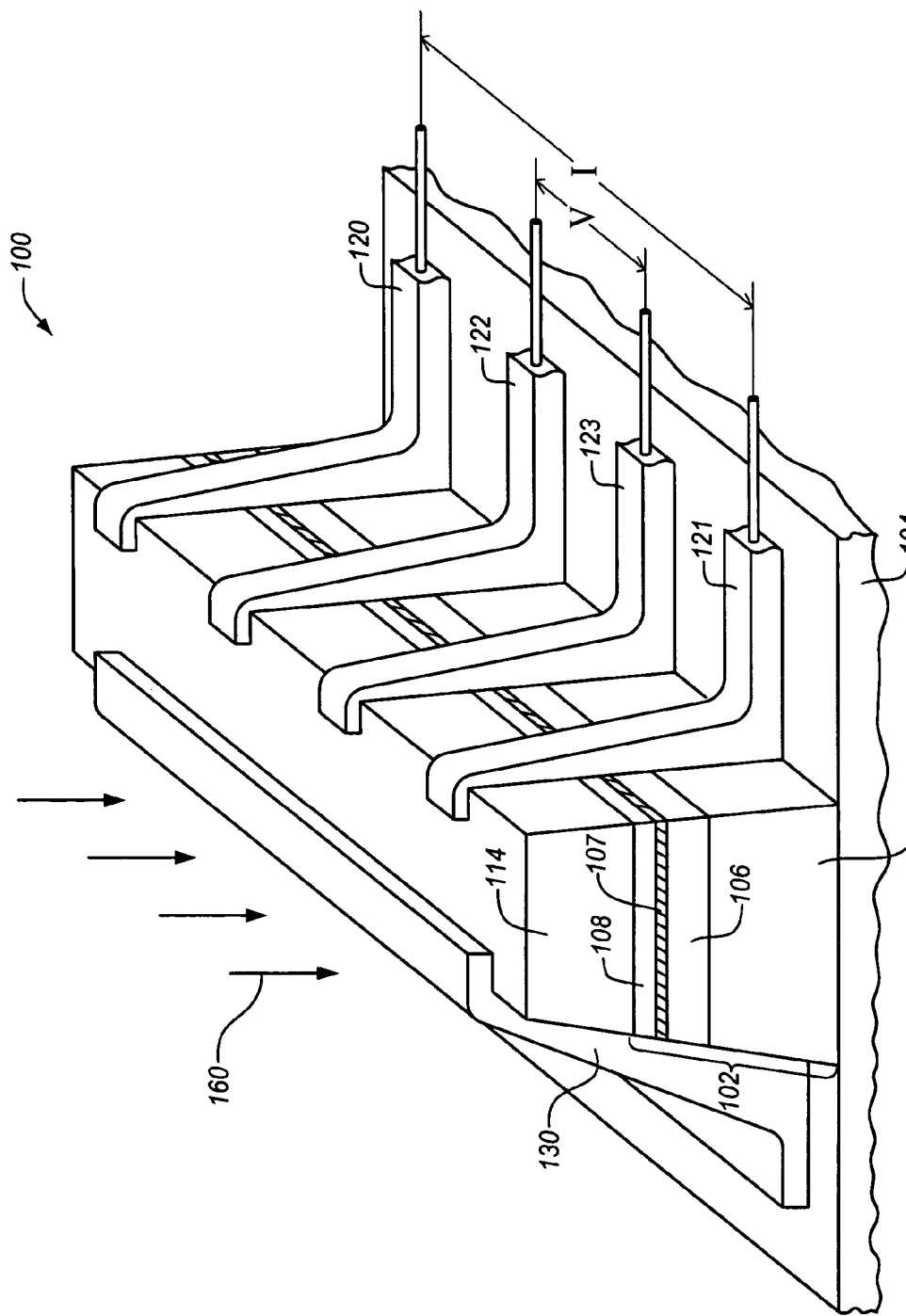
FIG. 1 is an isometric view of an EMR element in the prior art.

FIG. 1 is an isometric view of an EMR element 100 in the prior art. The EMR element 100 includes an EMR structure 102 that is a III-V heterostructure formed on a semiconducting substrate 104, such as GaAs. However, the EMR element described in this invention is not restricted to III-V semiconductor materials. For example, the EMR element may also be formed on a Silicon base. The EMR structure 102 is a mesa above substrate 104 that results from a subtractive process, such as Reactive Ion Etching (RIE). The EMR structure 102 includes a first layer 106 of semiconducting material having a first band-gap, a second layer 107 of semiconducting material formed on top of the first layer 106 and having a second band gap smaller than the first band gap, and a third layer 108 of semiconducting material formed on top of the second layer 107 and having a third band gap greater than the second band gap. The materials in the first layer 106 and the third layer 108 may be similar or identical. An energetic potential well (quantum well) is created by the first, second, and third layers 106-108 due to the different band-gaps of the different materials. Thus, carriers can be confined inside the second layer 107, which is considered the EMR active layer in the EMR element 100.

The first layer 106 is typically formed on top of a buffer layer 112 that may be one or more layers. The buffer layer 112 comprises several periods of a superlattice structure that function to prevent impurities present in the substrate 104 from migrating into the functional layers 106-108. In addition, the buffer layer 112 is chosen to accommodate the typically different lattice constants of the substrate 104 and the functional layers 106-108 of the EMR structure 102 to thus act as a strain relief layer between the substrate and the functional layers.

One or more doped layers are incorporated into the semiconducting material in the first layer 106, the third layer 108, or both, and spaced apart from the boundary of the second and third semiconducting materials. The doped layers provide electrons (if n-doped) or holes if (p-doped) to the quantum well. The electrons or holes are concentrated in the quantum well in the form of a two-dimensional electron gas (2DEG) or hole gas (2DHG), respectively.

As described in the previously-cited references, the layers 106-108 may be a heterostructure of the substances $Al_{0.09}In_{0.91}Sb$, InSb, and $Al_{0.09}In_{0.91}Sb$ respectively, grown onto a semi-insulating GaAs substrate 104 with a buffer layer 112 in between. InSb is a narrow band-gap semiconductor. Narrow band-gap semiconductors typically exhibit high electron mobility, since the effective electron mass is greatly reduced. Typical narrow band-gap materials are InSb and InAs. For example, the room temperature electron mobility of InSb and InAs are ~70,000 $cm^2/Vs$ and ~35,000 $cm^2/Vs$, respectively.

The bottom $Al_{0.09}In_{0.91}Sb$ layer 106 formed on the buffer layer 112 has a thickness in the range of approximately 1-3 microns and the top $Al_{0.09}In_{0.91}Sb$ layer 108 has a thickness in the range of approximately 10 to 1000 nm, typically 50 nm. The doping layers incorporated into layer 106 or 108 have a thickness from one monolayer (delta-doped layer) up to 10 nm. The doping layer is spaced from the $InSb/Al_{0.09}In_{0.91}Sb$ boundaries of first and second or second and third semiconducting materials by a distance of 10-300 Å. The preferred doping is n-doping since electrons typically have higher mobility than holes. The typical n-dopant is Silicon with a concentration in the range of 1 to $10^{19}/cm^3$. The deposition process for the EMR structure 102 is preferably molecular-beam-epitaxy, but other epitaxial growth methods can be used.

A capping layer 114 is formed over the EMR structure 102 to protect the device from corrosion. The capping layer is formed of an insulating material such as oxides or nitrides of aluminum or silicon (e.g., $Si_3N_4$, $Al_2O_3$) or a non-corrosive semi-insulating semiconductor.

Two current leads 120-121 and two voltage leads 122-123 are patterned over one side of the mesa of EMR structure 102 so that they make electrical contact with the active region. A metallic shunt 130 is patterned on the side of the mesa opposite the current and voltage leads 120-123 of the EMR structure 102 so that it makes electrical contact with the active region. An applied magnetic field 160 (i.e., the magnetic field to be sensed) is shown by the arrows and is normal to the plane of the films in the EMR structure 102. The leads are comprised of metallic materials, such as In, Au, AuGe, or AuSn, to provide an ohmic or low Schottky barrier contact between the lead material and the semiconductor. The leads 120-123 are typically formed after formation of the capping layer 114, and sometimes after removal of some of the capping layer material.

Figure 2:
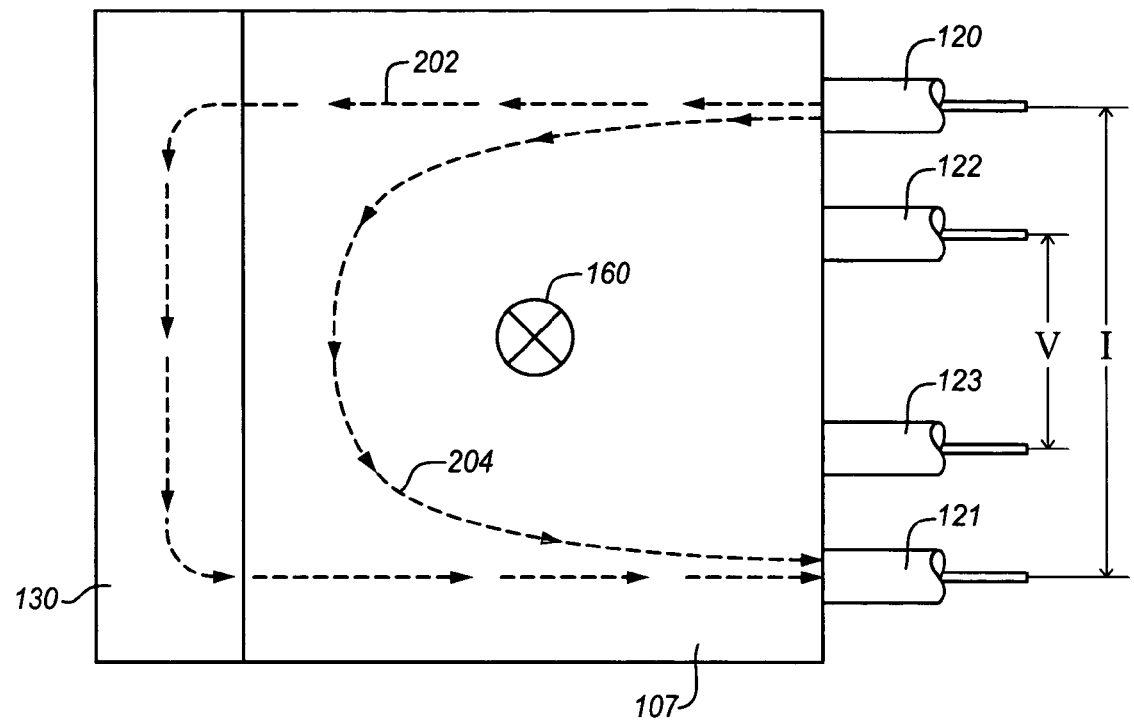
FIG. 2 is a top schematic view of the EMR element through a section of the active layer in the prior art.

FIG. 2 is a top schematic view of the EMR element 100 through a section of active layer 107 in the prior art. FIG. 2 illustrates the basic operation of the EMR element 100. In the absence of an applied magnetic field 160, sense current through current leads 120-121 passes into the semiconductor active layer 107 and is shunted through shunt 130, as shown by arrows 202. When an applied magnetic field 160 is present, as shown by the arrow tail into the paper in FIG. 2, current is deflected from shunt 130 and passes primarily through the active layer 107, as shown by arrow 204. The change in electrical resistance due to the applied magnetic field is detected across the voltage leads 122, 123.

The EMR sensor 100 described above is difficult to fabricate. The lithography for shunt 130 and the leads 120-123 must be done on a non-planar surface (i.e, the sides of the mesa) so that electrical contact can be made with the exposed edges of the active layer. In particular, deposition at an angle through a shadow mask has been employed in the prior art.

The most common approach to fabricating ohmic contacts on GaAs or other III-V semiconductors, such as InSb or InAs, is to apply an appropriate metallization to the wafer in a desired pattern and then alloy the metal into the III-V semiconductor by rapid thermal annealing. During the process, a component of the metal enters into the III-V semiconductor and highly dopes the surface layer. Candidate species for doping are Si, Ge, Sn, and Te for n-type, and Zn, Cd, Be, and Mg for p-type III-V materials. Au and Au alloys, such as AuGe or AuSn, are the most common and preferred materials for ohmic contact fabrication on n-type materials. A typical contact resistance area product for an ohmic contact is in the range of 1E-7 to 1E-6 Ohm·cm$^2$.

If AuGe is used, it is applied in proportions that represent a eutectic alloy (88% Au and 12% Ge by weight). This eutectic melts at 360° C. and thus any thermal annealing is carried out at temperatures exceeding 360° C. Other elements may be added to wet the alloy and prevent it from clustering up during the annealing process. Ni, Ag, or Lu are common choices of wetting agents for AuGe and may be either added to the alloy or applied before or after applying the AuGe layer. Ni is also known to enhance the diffusivity of Ge or other dopants into the III-V semiconductor. The resulting contact after annealing is then an alloy comprising AuGeX, where X=Ni, Ag or Lu.

The contact metal may be applied by e-beam or thermal evaporation, sputtering, or other common thin film techniques known in the semiconductor industry. The wetting layer of Ni, Ag, or Lu may also be deposited by e-beam evaporation, thermal evaporation, or sputtering. Approximately 25-30 nm of Ni are used for every 100 nm of AuGe. The exact thickness of the AuGe is not critical; however 50-250 nm is preferred. Much thinner layers of AuGe will typically result in higher contact resistance. Alloyed AuGeX (X=Ni, Ge, or Lu) generally has poor sheet resistance and thus an extra layer of Au may be added on top of the lead structures to form an AuGeX/Au multilayer with a reduced lead sheet resistance. In addition to Au as one of the layers in the multilayer structure, other materials may be used to lower lead sheet resistance, including Cu, Ag, Pt, or Pd.

In addition to Au and Au alloys, other materials suitable for the final lead and shunt are In or alloys of Ag, In, Pt, Pd, Sn, and Ti, such as alloys of AgIn, AgSn, AgInGe, TiPd, PdGe, SnNi, and SnSb.

In FIG. 1, another problem arising from the geometry of the structure of the EMR element 100 is to obtain low ohmic contact resistances between the active region of the EMR structure 102 and the current and voltage leads 120-123. The contact resistance area is determined by the thickness of the active region and the width of the leads 120-123 contacting the active region. Assuming a contact resistance area product of 1E-7 Ohm·cm$^2$, a 20 nm thick active region, and a 20 nm wide lead, the contact resistance would be 25 kOhms for each lead 120-123. It is desirable to form an EMR element that has a lower ohmic contact resistance.

FIGS. 3-18 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described, but only by the claims and their equivalents.

First Embodiment of an EMR Element—FIGS. 3-7

Figure 3:
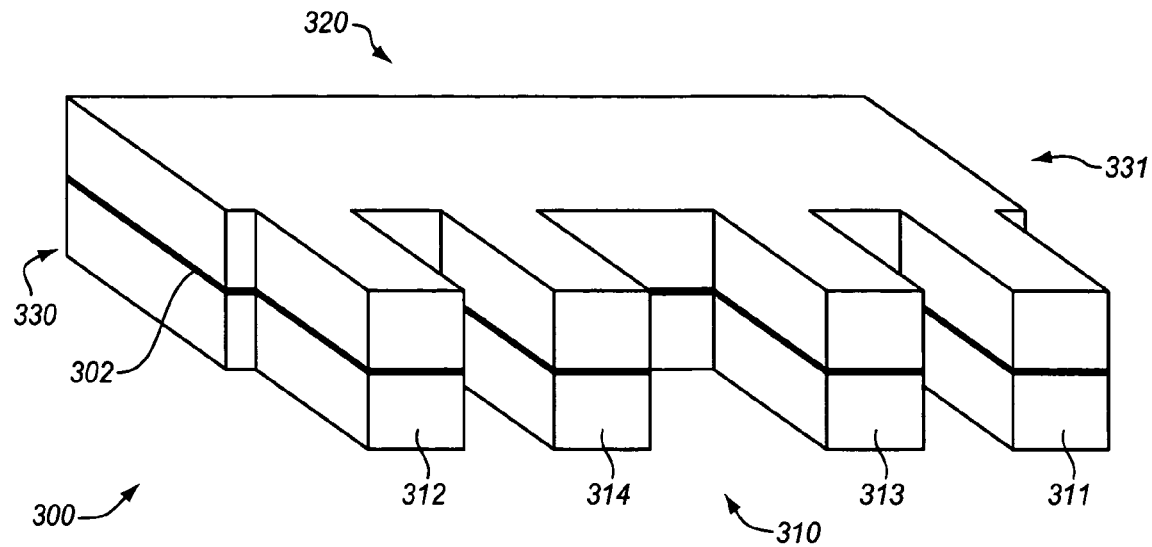
FIG. 3 is an isometric view of an EMR structure for an EMR element in an exemplary embodiment of the invention.

FIG. 3 is an isometric view of an EMR structure 300 for an EMR element in an exemplary embodiment of the invention. EMR structure 300 may be formed with the same or similar semiconductor layers as described for EMR structure 102 (see FIG. 1), or may be formed in any other desired manner. One or more layers of EMR structure 300 defines an active region 302 that may comprise a two-dimensional electron gas (2DEG) or hole gas (2DHG). The active region 302 is shown as a single layer for illustrative purposes, but the active region 302 may comprise multiple layers of semiconductor material as described above.

EMR structure 300 has a different shape than prior EMR structures, such as EMR structure 102 (see FIG. 1). EMR structure 300 has a first side surface 310, an opposing second side surface 320, and third and fourth side surfaces 330 and 331. The first side surface 310 has a plurality of lead protrusions 311-314 that extend outwardly from the main body of EMR structure 300. The lead protrusions 311-314 are used to form the current and voltage leads for an EMR element. Although four lead protrusions 311-314 are shown in FIG. 3, there may be more or less lead protrusions as desired. The active region 302 extends through each lead protrusion and is accessible along a perimeter of each of the lead protrusions 311-314. The perimeter of each lead protrusion 311-314 comprises the outer side surfaces of the lead protrusions on which the active region is accessible. The bottom surface of each lead protrusion 311-314 sits upon a substrate, so the bottom surface is not accessible. The top surface of each lead protrusion 311-314 is accessible, but the active region does not contact the top surface in this embodiment. Therefore, the perimeter comprises the outer side surfaces of each lead protrusion 311-314, which comprises the three side surfaces of each lead protrusion 311-314.

The lead protrusions 311-314 in FIG. 3 are rectangular, but may have any desired shape or size. The purpose of the lead protrusions is to provide a larger contact area between the active region 302 and the conductive material to be deposited to form the current and voltage leads. Therefore, the length and width of a lead protrusion 311-314 determines the size of the perimeter of the lead protrusion. The larger the perimeter, the larger the contact area for the active region. The size and shape of the lead protrusions 311-314 may vary depending on the desired contact area. For instance, as an alternative to a rectangular shape of the lead protrusions 311-314, the lead protrusions 311-314 may be wider away from the main body of EMR structure 300 to maximize the perimeter of each lead protrusion 311-314.

Figure 4:
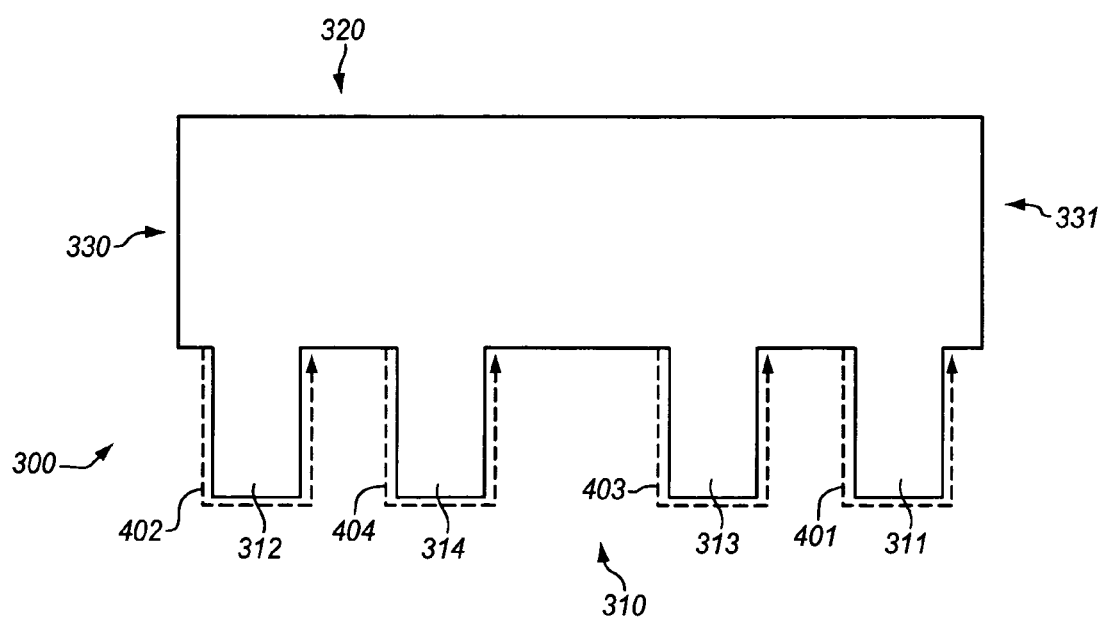
FIG. 4 is a top view of the EMR structure in an exemplary embodiment of the invention.

FIG. 4 is a top view of EMR structure 300 in an exemplary embodiment of the invention. The dotted arrows 401-404 around the lead protrusions 311-314 illustrate the perimeter of each lead protrusion 311-314 where the active region (not visible) is accessible.

Figure 5:
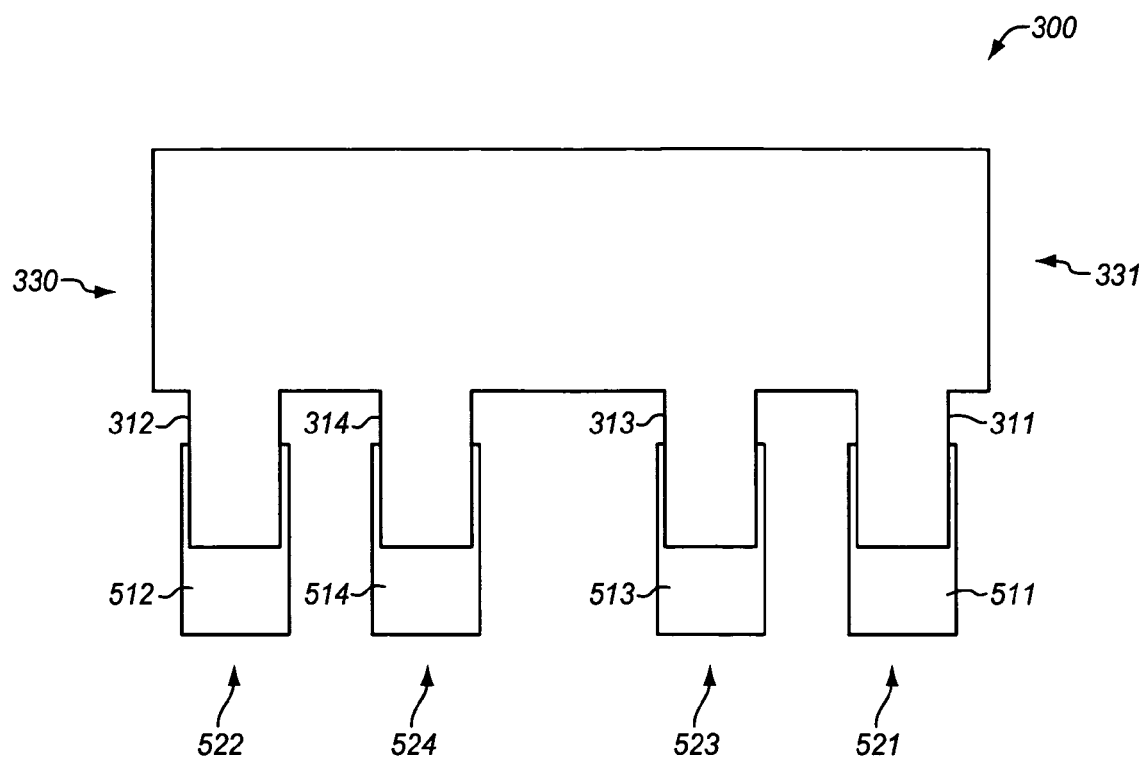
FIG. 5 is a top view of the EMR structure with conductive material formed along the perimeter of each lead protrusion in an exemplary embodiment of the invention.

FIG. 5 is a top view of EMR structure 300 with conductive material 511-514 formed along the perimeter of each lead protrusion 311-314 in an exemplary embodiment of the invention. Conductive material 511-514, such as In, Au, AuGe, or AuSn, is formed along the perimeter of each lead protrusion 311-314. The conductive material 511-514 contacts the active region of the EMR structure 300 along the perimeter of each lead protrusion 311-314. The lead protrusion 311-314 and the corresponding conductive material 511-514 contacting the active region of each lead protrusion 511-314 form leads 521-524 for the EMR element. As one example, leads 521 and 522 may comprise current leads, and leads 523 and 524 may comprise voltage leads. In another example, leads 522 and 523 may comprise current leads and leads 524 and 521 may comprise voltage leads. In yet another example, leads 522 and 523 may comprise voltage leads and leads 524 and 521 may current leads. The spacing between each pair of leads and the distance of the outer leads 522 and 521 from the side surfaces 330 and 331 of the sensor, respectively, are generally optimized for signal.

Figure 6:
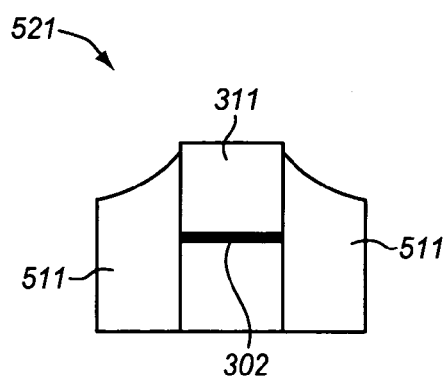
FIG. 6 is a cross-sectional view of a lead in an exemplary embodiment of the invention.

FIG. 6 is a cross-sectional view of lead 521 in an exemplary embodiment of the invention. Lead 521 has conductive material 511 on left and right side surfaces of lead protrusion 311, and on a side surface of lead protrusion 311 which is out of the page in FIG. 6 and is not shown. Thus, the conductive material 511 contacts the active region 302 along the perimeter of lead protrusion 311. Lead 521 advantageously has reduced ohmic contact resistance because the contact area between the conductive material 511 and the active region 302 is increased as compared to most prior EMR elements. Assume for example that lead protrusion 311 is 150 nm long and 20 nm wide. The contact area may then be as large as 320 nm if the conductive material 511 contacts the entire perimeter of the lead protrusion 311. Compare this to the prior art contact area described in FIG. 1 that is the width of a typical lead (about 20 nm). The contact area in the structure of the invention is advantageously much larger, which produces reduced ohmic contact resistance.

Also in FIG. 6, the conductive material 511 does not extend above a top surface of the lead protrusion 311. The top surface of the conductive material 511 is substantially planar to the top surface of the lead protrusion 311. This is advantageous for the mode of operation where the EMR sensor is flying on an air-bearing with its top surface being the air bearing surface.

Figure 7:
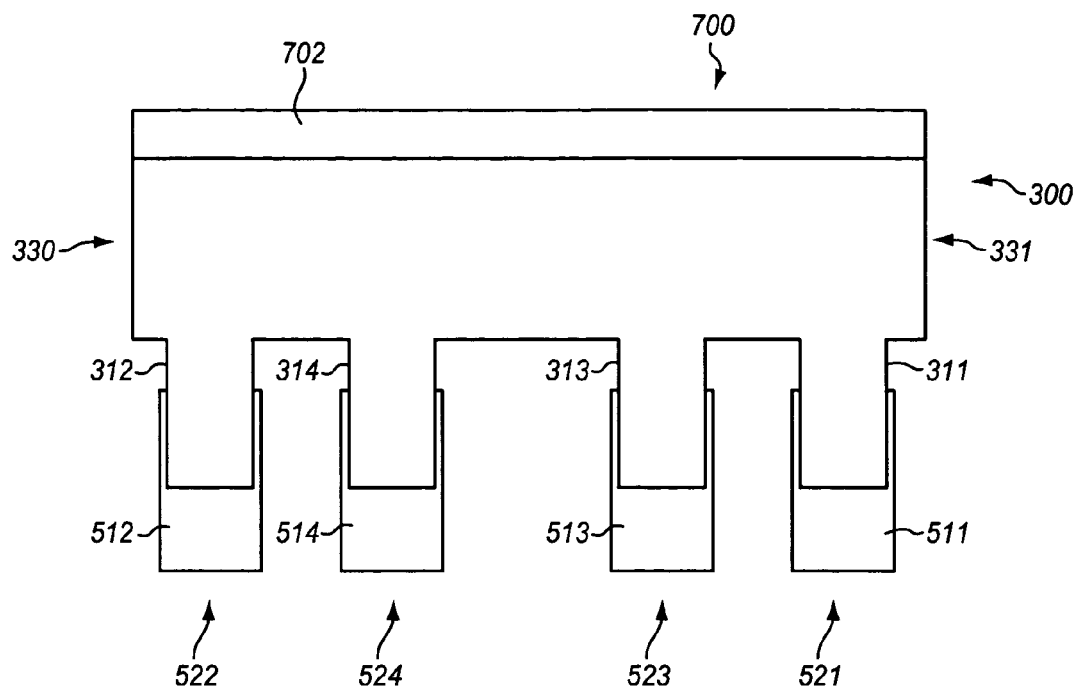
FIG. 7 is a top view of the EMR structure with conductive material formed along a second side surface in an exemplary embodiment of the invention.

FIG. 7 is a top view of EMR structure 300 with conductive material 702 formed along a second side surface 320 (see FIG. 3) in an exemplary embodiment of the invention. The conductive material 702 forms a shunt for the EMR element. FIG. 7 shows the completed structure of an EMR element 700. EMR element 700 may comprise a EMR read element, such as one used in a magnetic disk drive system, a scanning probe microscope, or other EMR elements. In these and similar EMR elements, the ability to achieve electrical connection to the 2DEG with low contact resistance enhances the device operation, in particular by improving signal to noise performance by reducing parasitic noise resistance contributions.

Figure 8:
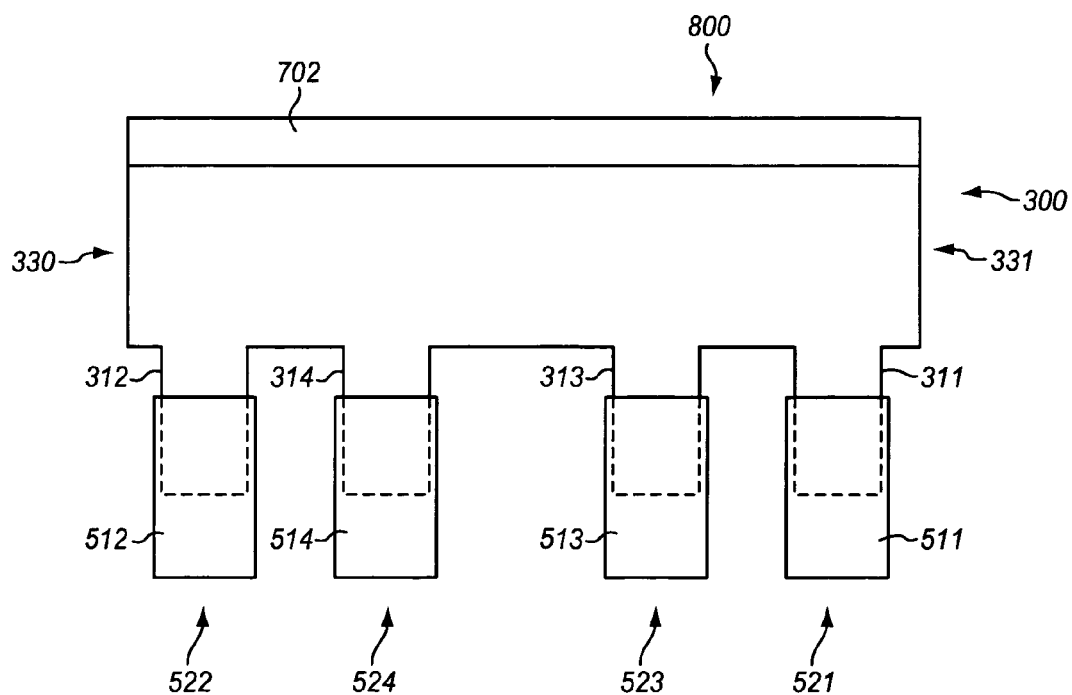
FIG. 8 is a top view of another EMR element in an exemplary embodiment of the invention.
Figure 9:
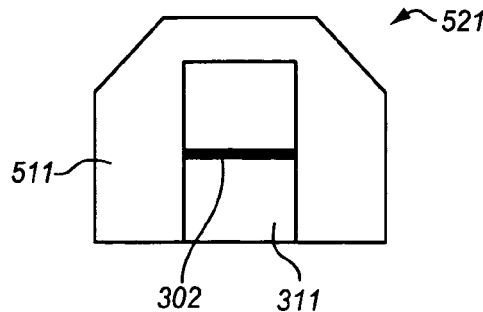
FIG. 9 is a cross-sectional view of a lead with conductive material formed on the top surface of the lead protrusion in an exemplary embodiment of the invention.

Second Embodiment of an EMR Element—FIGS. 8-9

FIG. 8 is a top view of another EMR element 800 in an exemplary embodiment of the invention. EMR element 800 has a similar structure as EMR element 700. However, in EMR element 800, the conductive material 511-514 for the leads 521-524 is also formed on the top surface of lead protrusions 311-314. FIG. 9 is a cross-sectional view of lead 521 with the conductive material 511 formed on the top surface of the lead protrusion 311.

Method of Fabrication of an EMR Element—FIGS. 10-17

Figure 10:
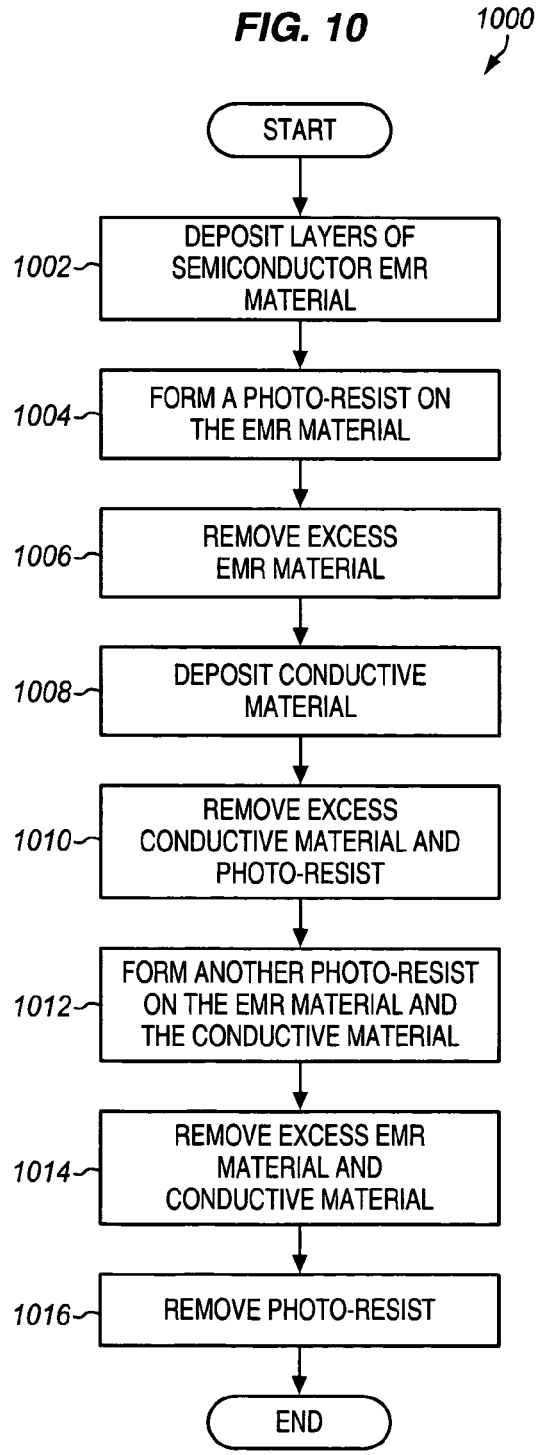
FIGS. 10-17 illustrate a method of fabricating an EMR element in an exemplary embodiment of the invention.
Figure 11:
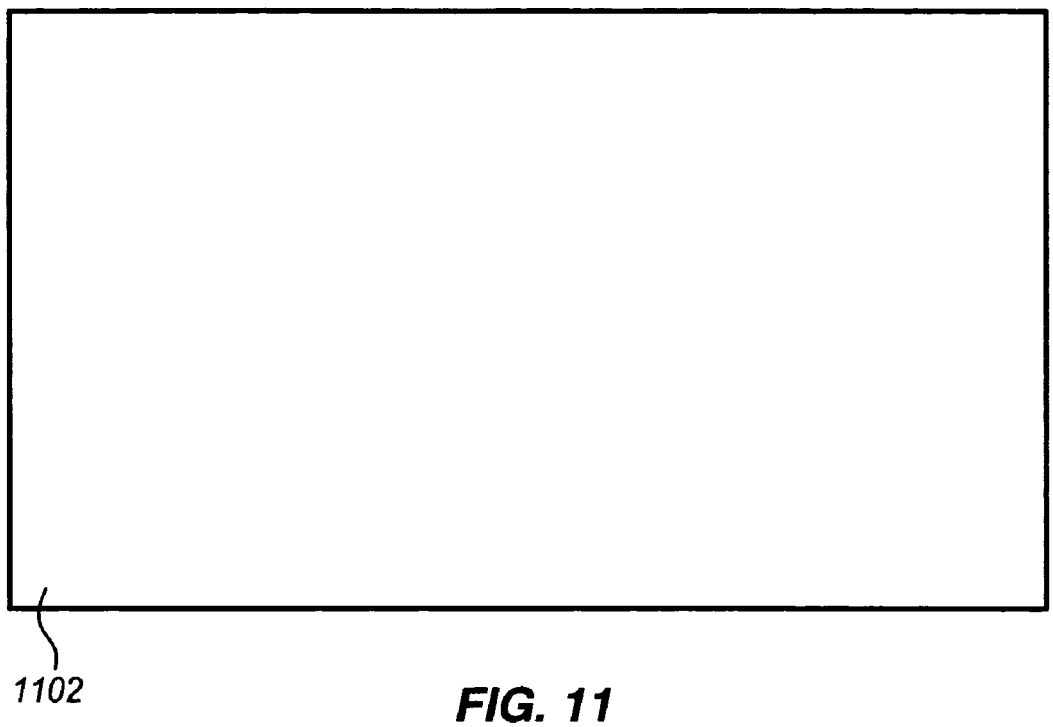

FIGS. 10-17 illustrate a method 1000 of fabricating an EMR element in an exemplary embodiment of the invention. The EMR elements of the invention may be fabricated according to other methods. In step 1002, the layers of semiconductor EMR material 1102 are deposited, as is illustrated in FIG. 11. The EMR material 1102 is deposited on some type of substrate (not shown). At least one of the layers of EMR material forms an active region, such as a 2DEG or 2DHG. Exemplary layers of EMR material were described in FIG. 1.

Figure 12:
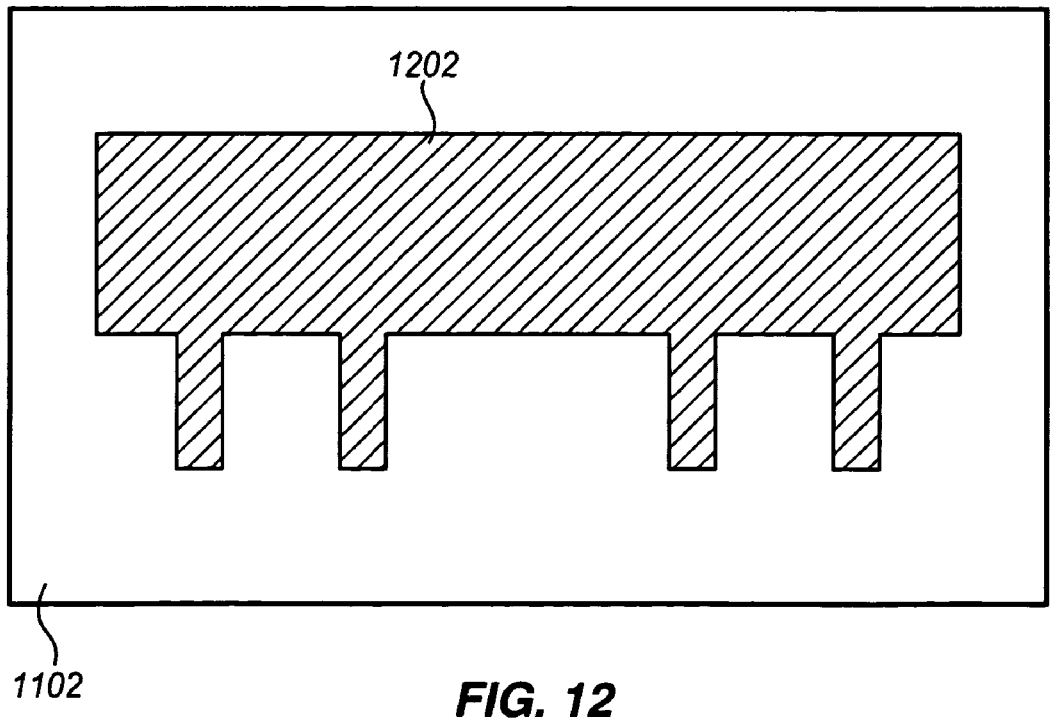

In step 1004 of FIG. 10, a photo-resist 1202 is formed on the EMR material 1102, as is illustrated in FIG. 12. The photo-resist is formed to have a pattern that defines a desired EMR structure. An exemplary EMR structure is shown in FIG. 4. In FIG. 12, the photo-resist 1202 has a comb-like structure. The teeth of the comb-like structure cover the portions of the EMR material 1102 that will be the lead protrusions for the EMR structure. The distance between each pair of lead protrusions and between the outer lead protrusions and the sensor edge may vary and is generally optimized for signal.

Figure 13:
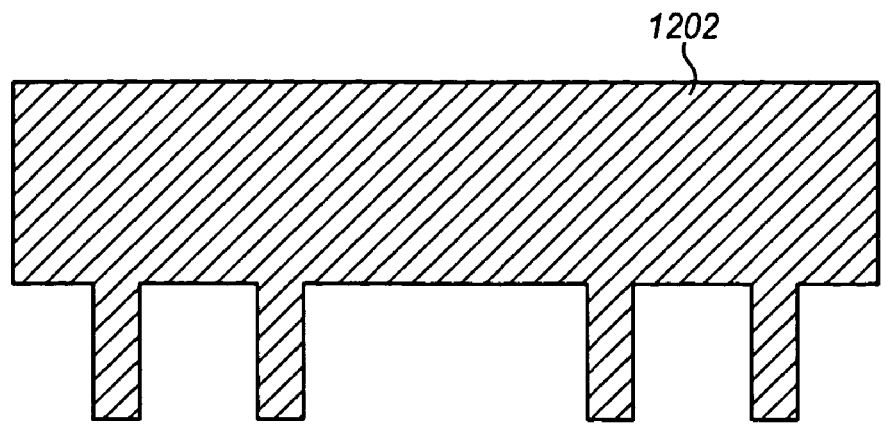

In step 1006 of FIG. 10, a removal process, such as ion milling or reactive ion etching (RIE), is performed to remove the excess EMR material not protected by the photo-resist 1202. FIG. 13 illustrates the photo-resist 1202, with the remaining EMR material underneath, after the removal process. The remaining material comprises the EMR structure for this EMR element. As in FIG. 4, the EMR structure includes a plurality of lead protrusions on a first side surface of the EMR structure (which is the bottom surface in FIG. 13).

Figure 14:
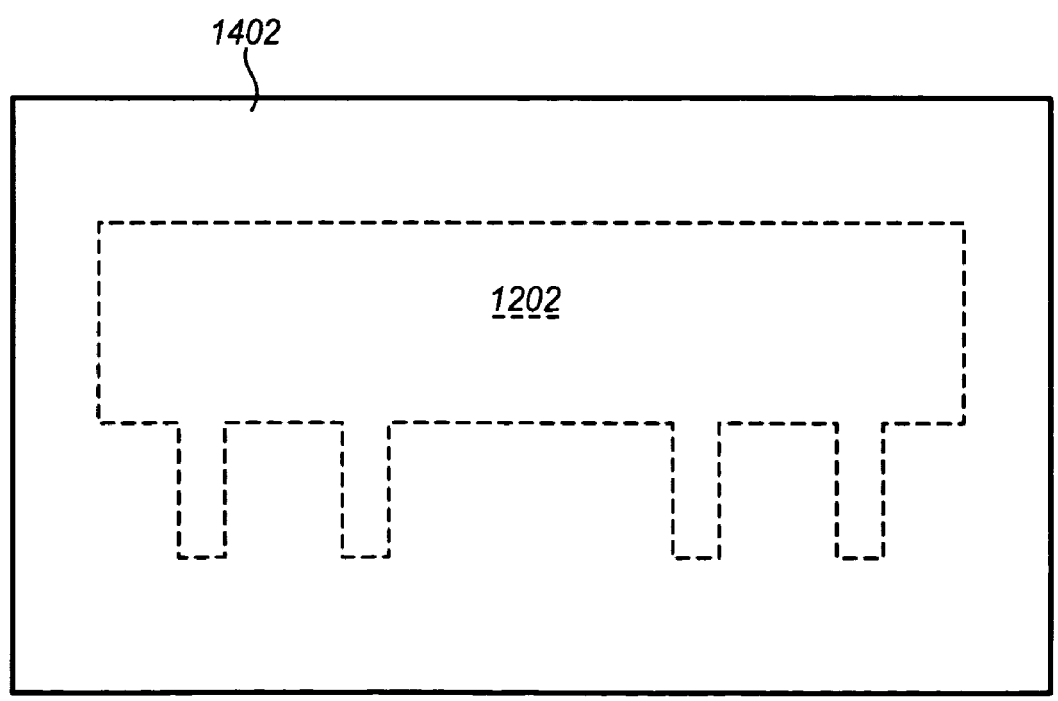

In step 1008 of FIG. 10, conductive material 1402 is deposited on the photo-resist 1202 and around the EMR structure, as is illustrated in FIG. 14. The dotted lines in FIG. 14 show the photo-resist 1202 beneath the conductive material. The conductive material contacts the active region around the perimeter of the EMR structure, including around the perimeter of each of the lead protrusions. One advantage of this fabrication method is that the conductive material, by being deposited in this manner, is self-aligned with the active region of the EMR structure. Referring to FIG. 7, conductive material 702 is self aligned with side surface 320 using this process (see also FIG. 4). This results in a lead to EMR contact region that is precisely defined. There is no overlap of lead material over the EMR structure which would occur in a two mask process. Moreover, the overlap would not be reproducible since in a two mask process, there are alignment tolerances associated with placing a second shaped mask relative to a first pattern.

Figure 15:
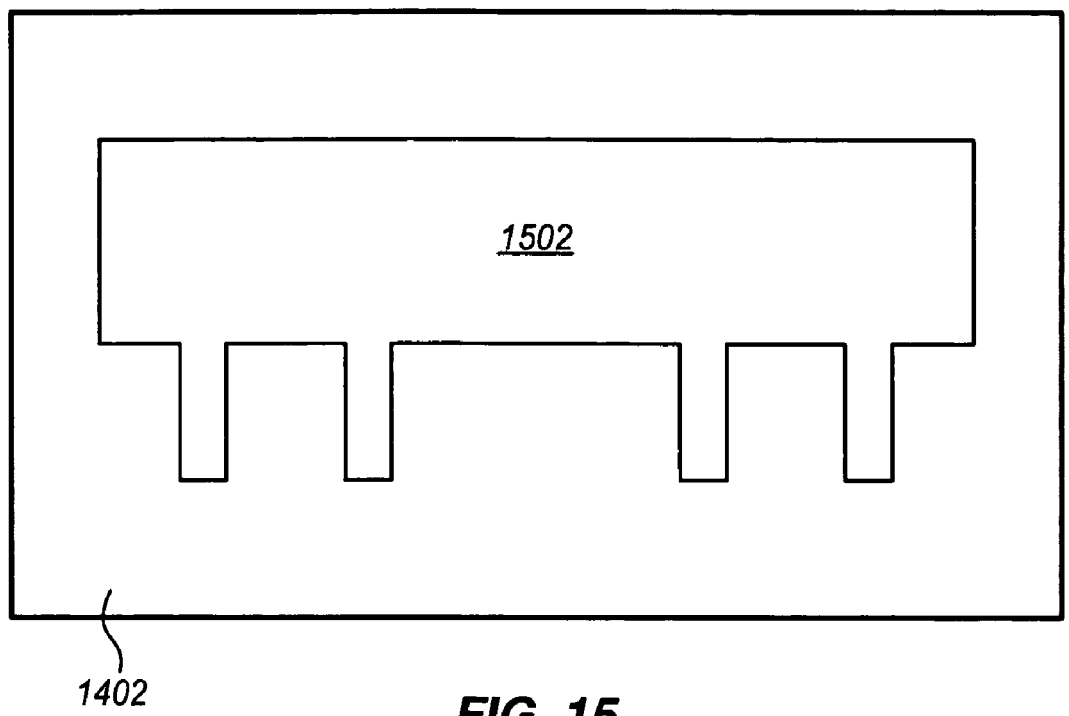

In step 1010 of FIG. 10, another removal process is performed to remove the photo-resist 1202 and the conductive material 1402 on top of the photo-resist 1202, as is illustrated in FIG. 15. For instance, the photo-resist 1202 may be dissolved in a solvent. When the photo-resist 1202 is dissolved, the conductive material 1402 on top of the photo-resist 1202 is removed. The EMR structure 1502 with a plurality of lead protrusions on a first side surface (the bottom side in FIG. 15), and the conductive material 1402 surrounding the EMR structure 1502 remain after the removal process. Another advantage of this fabrication method is that the contact junction between the conductive material and the active region is formed using a single mask. An advantage of a single mask process is that by construct, there is no overlap between the EMR and the leads, leaving a reproducible junction between the EMR and the leads. Two mask processes result in overlap since any alignment between the layers cannot be perfect and hence not reproducible.

Figure 16:
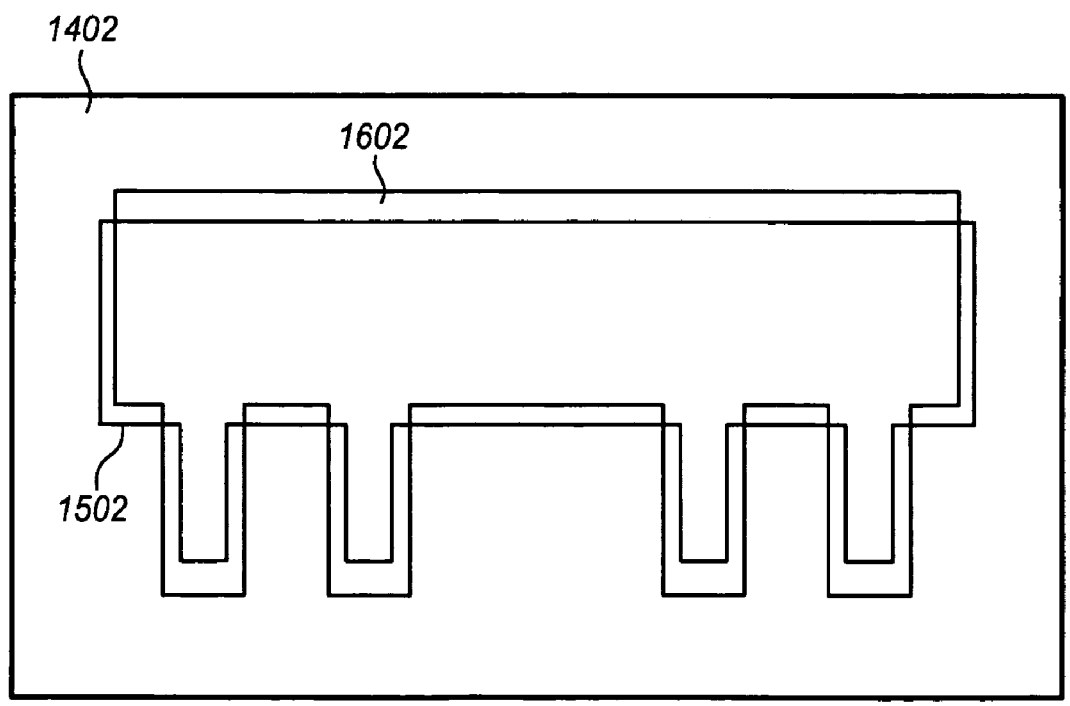

In step 1012 of FIG. 10, another photo-resist 1602 is formed, as is illustrated in FIG. 16. The photo-resist 1602 has a pattern that covers the portion of the EMR structure 1502 and the portion of the conductive material 1402 that is to remain. The photo-resist 1602 covers a portion of the conductive material 1402 surrounding the perimeter of each lead protrusion of the EMR structure 1502, which will form the leads for the EMR element. The photo-resist 1602 also covers a portion of the conductive material 1402 along a second side surface of the EMR structure 1502 (the top surface in FIG. 16), which will form the shunt for the EMR element.

Figure 17:
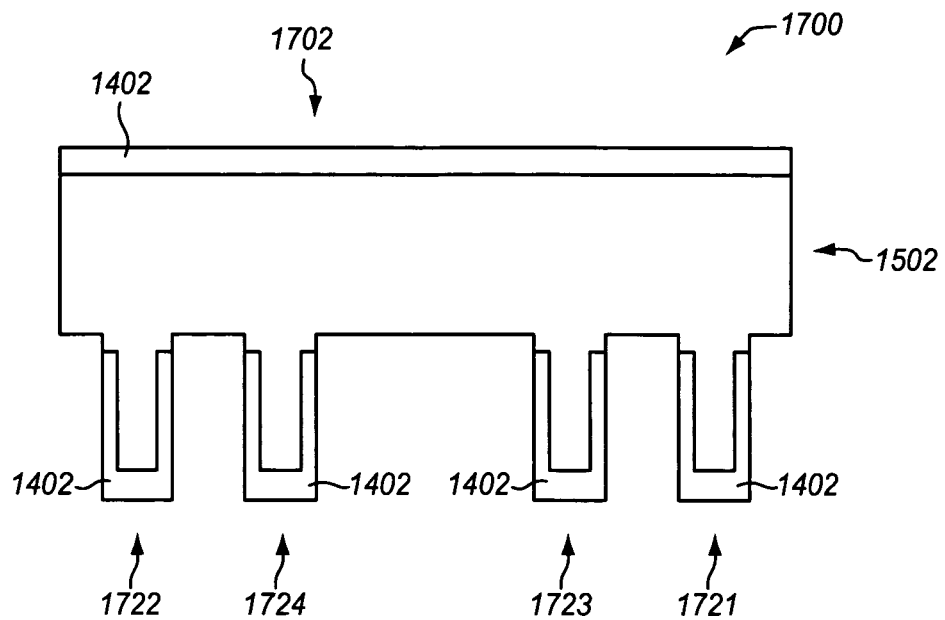

In step 1014 of FIG. 10, a removal process is performed, such as an ion-milling process or an RIE process, to remove the material not protected by the photo-resist 1602. In step 1016, the photo-resist 1602 is removed. FIG. 17 illustrates the remaining materials after the photo-resist 1602 is removed. The remaining materials form EMR element 1700. In EMR element 1700, the EMR structure 1502 has a plurality of lead protrusions. Each lead protrusion has conductive material 1402 along its perimeter (contacting the active region) to form the leads 1721-1724 for EMR element 1700. Leads 1721 and 1722 may comprise the current leads, and leads 1723 and 1724 may comprise the voltage leads. Alternatively, leads 1772 and 1723 may comprise the current leads, and leads 1724 and 1721 may comprise the voltage leads. Furthermore, leads 1772 and 1723 may comprise the voltage leads, and leads 1724 and 1721 may comprise the current leads. The EMR structure 1502 also has strip of conductive material on the surface opposite the leads to form the shunt 1702 for EMR element 1700.

Figure 18:
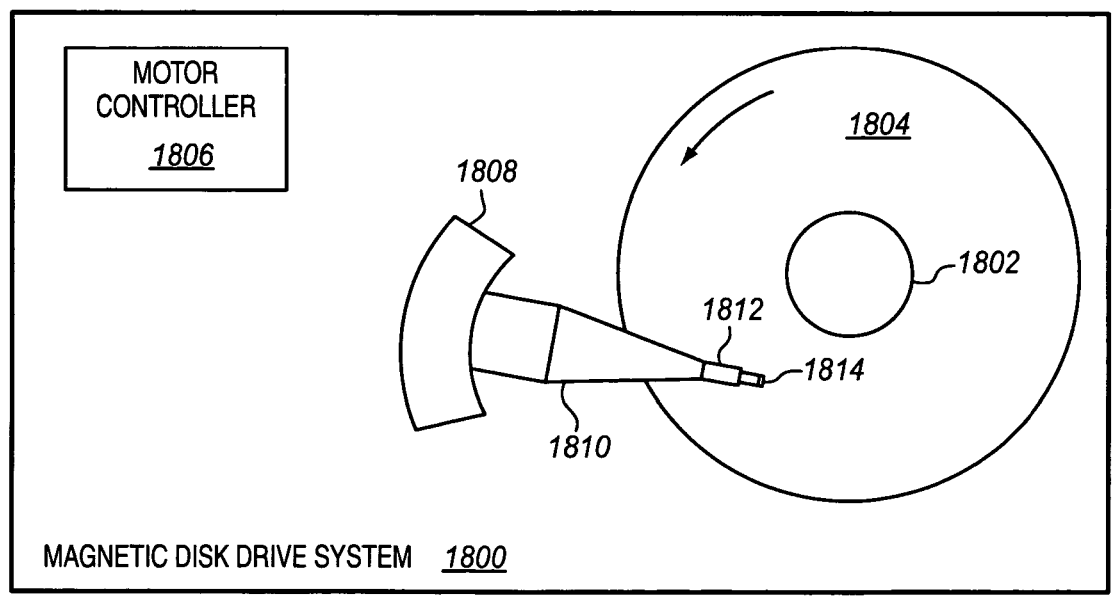
FIG. 18 illustrates a magnetic disk drive system in an exemplary embodiment of the invention.

Magnetic Disk Drive System—FIG. 18

FIG. 18 illustrates a magnetic disk drive system 1800 in an exemplary embodiment of the invention. Magnetic disk drive system 1800 includes a spindle 1802, a magnetic disk 1804, a motor controller 1806, an actuator 1808, an actuator arm 1810, a suspension arm 1812, and a recording head 1814 utilizing the shielding described herein. The recording head 1814 may include an EMR element as described herein. Spindle 1802 supports and rotates a magnetic disk 1804 in the direction indicated by the arrow. A spindle motor (not shown) rotates spindle 1802 according to control signals from motor controller 1806. Recording head 1814 is supported by suspension arm 1812 and actuator arm 1810. Actuator arm 1810 is connected to actuator 1808 that is configured to rotate in order to position recording head 1814 over a desired track of magnetic disk 1804. Magnetic disk drive system 1800 may include other devices, components, or systems not shown in FIG. 18. For instance, a plurality of magnetic disks, actuators, actuator arms, suspension arms, and recording heads may be used.

When magnetic disk 1804 rotates, an air flow generated by the rotation of magnetic disk 1804 causes an air bearing surface (ABS) of recording head 1814 to ride on a cushion of air a particular height above magnetic disk 1804. The height depends on the shape of the ABS. As recording head 1814 rides on the cushion of air, actuator 1808 moves actuator arm 1810 to position a read element (not shown) and a write element (not shown) in recording head 1814 over selected tracks of magnetic disk 1804.

We claim:

1. An extraordinary magnetoresistive (EMR) element, comprising:
   a semiconductor (EMR) structure that includes an active region, wherein a first side surface of the semiconductor EMR structure includes a plurality of lead protrusions unitarily extending from the first side surface, wherein each of the lead protrusions comprises a portion of the active region and the active region is accessible along outer side surfaces of the plurality of lead protrusions; and
   conductive material contacting the active region along at least a portion of the outer side surfaces of each of the plurality of lead protrusions to form leads for the EMR element.

2. The EMR element of claim 1 wherein two of the leads comprise current leads for the EMR element.

3. The EMR element of claim 1 wherein two of the leads comprise voltage leads for the EMR element.

4. The EMR element of claim 1 wherein the active region comprises a two-dimensional electron gas (2DEG).

5. The EMR element of claim 1 wherein the active region comprises a two-dimensional hole gas (2DHG).

6. The EMR element of claim 1 further comprising:
   conductive material contacting the active region along a second side surface of the semiconductor EMR structure opposite the first side surface to form a shunt.

7. The EMR element of claim 1 wherein the conductive material for the leads of the EMR element is planar to a top surface of the semiconductor EMR structure.

8. An extraordinary magnetoresistive (EMR) element, comprising:
   a semiconductor EMR structure that includes a two-dimensional electron gas (2DEG) active region, wherein a first side surface of the semiconductor EMR structure includes two current lead protrusions and two voltage lead protrusions each of the lead protrusions unitarily extending from the first side surface and comprising a portion of the active region, wherein the 2DEG active region is accessible along outer side surfaces of the two current lead protrusions and along outer side surfaces of the two voltage lead protrusions;
   conductive material contacting the 2DEG active region along at least a portion of the outer side surfaces of the two current lead protrusions to form two current leads for the EMR element.

9. The EMR element of claim 8 further comprising:
   conductive material contacting the 2DEG active region along a second side surface of the semiconductor EMR structure opposite the first side surface to form a shunt.

10. The EMR element of claim 8 wherein the conductive material for the two current leads and the two voltage leads is planar to a top surface of the semiconductor EMR structure.

11. A magnetic disk drive system, comprising:
   a magnetic disk; and
   a recording head that includes an extraordinary magnetoresistive (EMR) element for reading data from the magnetic disk, the EMR element comprises:
      a semiconductor EMR structure that includes an active region, wherein a first side surface of the semiconductor EMR structure includes a plurality of lead protrusions unitarily extending from the first side surface, wherein each of the lead protrusions comprises a portion of the active region and the active region is accessible along the perimeter of the plurality of lead protrusions;
      conductive material contacting the active region along at least a portion of the outer side surfaces of each of the plurality of lead protrusions to form leads for the EMR element; and
      conductive material contacting the active region along a second side surface of the semiconductor EMR structure opposite the first side surface to form a shunt.

12. The magnetic disk drive system of claim 11 wherein two of the leads for the EMR element comprise current leads.

13. The magnetic disk drive system of claim 11 wherein two of the leads for the EMR element comprise voltage leads.

14. The magnetic disk drive system of claim 11 wherein the active region comprises a two-dimensional electron gas (2DEG).

15. The magnetic disk drive system of claim 11 wherein the active region comprises a two-dimensional hole gas (2DHG).

16. The magnetic disk drive system of claim 11 wherein the conductive material for the leads of the EMR element is planar to a top surface of the semiconductor EMR structure.

* * * * *

UNITED STATES PATENT AND TRADEMARK OFFICE
CERTIFICATE OF CORRECTION

PATENT NO. : 7,633,718 B2 Page 1 of 1
APPLICATION NO. : 11/168070
DATED : December 15, 2009
INVENTOR(S) : Robert E. Fontana, Jr. et al.

It is certified that error appears in the above-identified patent and that said Letters Patent is hereby corrected as shown below:

Title Page, (*) Notice: Subject to any disclaimer, the term of this patent is extended or adjusted under 35 U.S.C. 154(b) by 581 days.

should read (*) Notice: Subject to any disclaimer, the term of this patent is extended or adjusted under 35 U.S.C. 154(b) by 765 days.

Signed and Sealed this

Third Day of August, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,633,718 B2 | |
| APPLICATION NO. | : 11/168070 | |
| DATED | : December 15, 2009 | |
| INVENTOR(S) | : Robert E. Fontana, Jr. | |

It is certified that error appears in the above-identified patent and that said Letters Patent is hereby corrected as shown below:

At column 10, line 49, please add "; and conductive material contacting the 2DEG active region along at least a portion of the outer side surfaces of the two voltage lead protrusions to form two voltage leads for the EMR element." to claim 8 to read --8. An extraordinary magnetoresistive (EMR) element, comprising:

a semiconductor EMR structure that includes a two-dimensional electron gas (2DEG) active region, wherein a first side surface of the semiconductor EMR structure includes two current lead protrusions and two voltage lead protrusions each of the lead protrusions unitarily extending from the first side surface and comprising a portion of the active region, wherein the 2DEG active region is accessible along outer side surfaces of the two current lead protrusions and along outer side surfaces of the two voltage lead protrusions;

conductive material contacting the 2DEG active region along at least a portion of the outer side surfaces of the two current lead protrusions to form two current leads for the EMR element; and conductive material contacting the 2DEG active region along at least a portion of the outer side surfaces of the two voltage lead protrusions to form two voltage leads for the EMR element.--

At column 11, line 15, please correct "the perimeter" to read --the outer side surface--.

Signed and Sealed this
Third Day of July, 2012

David J. Kappos
*Director of the United States Patent and Trademark Office*